United States Patent
Jung et al.

(10) Patent No.: US 10,816,710 B2
(45) Date of Patent: Oct. 27, 2020

(54) POLARIZING PLATE FOR LIGHT EMITTING DISPLAY DEVICE AND LIGHT EMITTING DISPLAY DEVICE INCLUDING SAME

(71) Applicant: SAMSUNG SDI CO., LTD., Yongin-si Gyeonggi-do (KR)

(72) Inventors: Ri Ra Jung, Suwon-si (KR); Eun Hwan Jeong, Suwon-si (KR); Dong Yoon Shin, Suwon-si (KR); Mun Bo Ko, Suwon-si (KR); Na Young Kim, Suwon-si (KR); Jin Joo Kim, Suwon-si (KR); Eun Su Park, Suwon-si (KR); Kyoung Ah Oh, Suwon-si (KR); Tae Joon Park, Suwon-si (KR); Su Yeon Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 95 days.

(21) Appl. No.: 16/086,296

(22) PCT Filed: Dec. 21, 2016

(86) PCT No.: PCT/KR2016/015006
§ 371 (c)(1),
(2) Date: Sep. 18, 2018

(87) PCT Pub. No.: WO2017/159969
PCT Pub. Date: Sep. 21, 2017

(65) Prior Publication Data
US 2019/0107657 A1    Apr. 11, 2019

(30) Foreign Application Priority Data
Mar. 18, 2016  (KR) .......................... 10-2016-0033057

(51) Int. Cl.
*H01L 33/00* (2010.01)
*H01L 51/40* (2006.01)
(Continued)

(52) U.S. Cl.
CPC .............. *G02B 5/3025* (2013.01); *B32B 7/12* (2013.01); *B32B 23/08* (2013.01); *B32B 23/20* (2013.01);
(Continued)

(58) Field of Classification Search
CPC ......... H01L 21/02505; H01L 21/02502; H01L 23/08; H01L 23/20; H01L 27/18;
(Continued)

(56) References Cited

U.S. PATENT DOCUMENTS 9,274,259 B2 * 3/2016 Jeon ........................ G02B 5/30
9,873,821 B2 * 1/2018 Mun ...................... C09J 133/14
(Continued)

FOREIGN PATENT DOCUMENTS

JP  2014-32270 A  2/2014
KR  10-2011-0098690 A  9/2011
(Continued)

*Primary Examiner* — Alonzo Chambliss
(74) *Attorney, Agent, or Firm* — Lewis Roca Rothgerber Christie LLP (57) ABSTRACT

Provided are a polarizing plate for a light emitting display device and the light emitting display device including same, the polarizing plate for a light emitting display device having a first adhesive film, a second protective layer, a polarizer, and a first protective layer sequentially laminated therein. The polarizing plate includes a UV absorber; and an as value of the polarizing plate is about −2.0 to about −20.0, and a bs value of the polarizing plate is about 3.0 to about 30.0.

29 Claims, 1 Drawing Sheet

(51) Int. Cl.
- *G02B 5/30* (2006.01)
- *G02B 5/28* (2006.01)
- *B32B 27/18* (2006.01)
- *G02B 5/18* (2006.01)
- *G02F 1/13363* (2006.01)
- *C09J 133/10* (2006.01)
- *G02B 1/14* (2015.01)
- *B32B 7/12* (2006.01)
- *B32B 23/08* (2006.01)
- *B32B 23/20* (2006.01)
- *B32B 27/30* (2006.01)
- *C08F 220/18* (2006.01)
- *C09J 11/06* (2006.01)
- *C09J 133/06* (2006.01)
- *H01L 27/32* (2006.01)
- *H01L 51/52* (2006.01)
- *C08K 5/3417* (2006.01)

(52) U.S. Cl.
CPC ............ *B32B 27/18* (2013.01); *B32B 27/306* (2013.01); *C08F 220/18* (2013.01); *C09J 11/06* (2013.01); *C09J 133/066* (2013.01); *C09J 133/10* (2013.01); *G02B 1/14* (2015.01); *G02B 5/18* (2013.01); *G02B 5/28* (2013.01); *G02B 5/30* (2013.01); *G02B 5/3016* (2013.01); *G02F 1/13363* (2013.01); *H01L 27/3244* (2013.01); *H01L 51/5281* (2013.01); *B32B 2307/42* (2013.01); *B32B 2307/71* (2013.01); *B32B 2457/20* (2013.01); *C08F 2800/20* (2013.01); *C08K 5/3417* (2013.01)

(58) Field of Classification Search
CPC ....... H01L 27/306; G02B 5/3025; G02B 1/14; G02B 5/28; B32B 7/12; G02F 1/133528
See application file for complete search history.

(56) References Cited

U.S. PATENT DOCUMENTS

| | | | | |
|---|---|---|---|---|
| 2007/0182885 A1* | 8/2007 | Egi | ................... | G02F 1/133528 349/96 |
| 2010/0279150 A1* | 11/2010 | Hatta | ................ | B32B 17/10761 428/704 |
| 2012/0170117 A1* | 7/2012 | Cho | ................... | G02B 5/3033 359/487.01 |
| 2013/0148199 A1* | 6/2013 | Jeon | ........................ | G02B 5/30 359/489.07 |

FOREIGN PATENT DOCUMENTS

| | | |
|---|---|---|
| KR | 10-2013-0074667 A | 7/2013 |
| KR | 10-2013-0143476 A | 12/2013 |
| KR | 10-2014-0118595 A | 10/2014 |
| WO | WO 2012/023616 A1 | 2/2012 |

* cited by examiner

POLARIZING PLATE FOR LIGHT EMITTING DISPLAY DEVICE AND LIGHT EMITTING DISPLAY DEVICE INCLUDING SAME

CROSS-REFERENCE TO RELATED APPLICATION(S)

This application is a National Phase patent application and claims priority to and the benefit of International Application Number PCT/KR2016/015006, filed on Dec. 21, 2016, which claims priority to and the benefit of Korean Patent Application No. 10-2016-0033057, filed on Mar. 18, 2016, the entire contents of each of which are incorporated herein by reference.

TECHNICAL FIELD

The present invention relates to a polarizing plate for light emitting displays and a light emitting display including the same.

BACKGROUND ART

An organic light emitting display is a self-emissive display apparatus and includes organic light emitting devices emitting green, red and blue colors. The organic light emitting display is inevitably exposed to external light including UV light in use. Organic light emitting devices can be damaged by long-term UV exposure, causing discoloration and degradation in lifespan. Therefore, the organic light emitting devices require external light stability. Such external light stability is also required for typical organic-inorganic hybrid light emitting devices.

A UV absorber is contained in a polarizing plate formed on an organic light emitting device to impart a UV absorption function. Typical UV absorbing agents such as triazole, benzophenone, and triazine absorb UV light only in a wavelength region of 260 nm to 380 nm, and cannot block UV light in the wavelength region of 400 nm, for example, in a wavelength region of 400 nm to 450 nm. Therefore, in a light emitting display including an optical device including a typical UV absorbing agent, UV light in the 400 nm wavelength band reaches the organic light emitting device, thereby provide a limit in improvement of lifetime of the light emitting device.

On the other hand, a polarizing plate essentially includes a polarizer. Since the polarizer is produced through adsorption of iodine, the polarizer can have a predetermined range of color values. The polarizing plate may further include a protective film, a retardation film, an adhesive film, and the like. The adhesive film is necessary to adhere the polarizing plate to the display. However, the UV absorber absorbing long wavelength UV light has a problem of exhibiting a yellow color. Therefore, it is necessary to adjust the color value of the polarizing plate in order to allow the polarizing plate to absorb long wavelength UV light and to use the same in the display.

The background technique of the present invention is disclosed in Japanese Unexamined Patent Publication No. 2014-032270.

SUMMARY

It is an object of the present invention to provide a polarizing plate having a color value applicable to a light emitting display although the polarizing plate contained a UV absorber capable of absorbing long wavelength UV light.

It is another object of the present invention to provide a polarizing plate capable of effectively blocking UV light having a wavelength of 450 nm or less to suppress damage to a light emitting device while improving lifetime thereof.

It is further object of the present invention to provide a light emitting display capable of preventing damage to a light emitting device and degradation in lifespan thereof due to external light.

It is further object of the present invention to provide a light emitting display capable of effectively blocking UV light even under severe conditions to prevent damage to the light emitting device and deterioration in lifespan thereof.

It is further object of the present invention to provide a light emitting display including a polarizing plate having a color value applicable to a light emitting display although the polarizing plate contained a UV absorber capable of absorbing long wavelength UV light.

In accordance with one aspect of the present invention, a polarizing plate for light emitting displays includes a first adhesive film, a second protective layer, a polarizer, and a first protective layer sequentially stacked in the stated order, wherein the polarizing plate contains a UV absorber and has an as value of about −2.0 to about −20.0 and a bs value of about 3.0 to about 30.0.

In accordance with another aspect of the present invention, a light emitting display includes a polarizing plate for light emitting displays according to the present invention.

In accordance with a further aspect of the present invention, a light emitting display includes a light emitting display unit and a polarizing plate stacked on the light emitting display unit, wherein the polarizing plate includes a first adhesive film, a second protective layer, a polarizer, and a first protective layer sequentially stacked in the stated order, and further contains a UV absorber, and the light emitting display has a color temperature variation rate of about 40% or less, as calculated by Equation 1:

$$\text{Color temperature variation rate}=(CT_1-CT_2)/CT_1 \times 100 \qquad \text{<Equation 1>}$$

(In Equation 1, wherein $CT_2$ and $CT_1$ are the same as defined in the detailed description of the invention.)

The present invention provided a polarizing plate having a color value applicable to a light emitting display although the polarizing plate contained a UV absorber capable of absorbing long wavelength UV light.

The present invention provided a polarizing plate capable of effectively blocking UV light having a wavelength of 450 nm or less to suppress damage to a light emitting device while improving lifetime thereof.

The present invention provided a light emitting display capable of preventing damage to a light emitting device and degradation in lifespan thereof due to external light.

The present invention provided a light emitting display capable of effectively blocking UV light even under severe conditions to prevent damage to the light emitting device and deterioration in lifespan thereof.

The present invention provided a light emitting display including a polarizing plate having a color value applicable to a light emitting display although the polarizing plate contained a UV absorber capable of absorbing long wavelength UV light.

DETAILED DESCRIPTION

Hereinafter, embodiments of the present invention will be described in detail with reference to the accompanying drawings to enable those skilled in the art to easily practice the present invention. It should be understood that the present invention may be embodied in different ways and is not limited to the following embodiments. In the drawings, portions irrelevant to the description will be omitted for clarity. Like components will be denoted by like reference numerals throughout the specification.

As used herein, spatially relative terms such as "upper" and "lower" are defined with reference to the accompanying drawings. Thus, it will be understood that "upper surface" can be used interchangeably with "lower surface".

As used herein, "adhesive film for polarizing plates" and "adhesive composition for polarizing plates" can be simply represented by "adhesive film" and "adhesive composition", respectively. As used herein, "(meth)acryl" means acryl and/or methacryl.

As used herein, "in-plane retardation (Re)" is calculated by Equation A and "out-of-plane retardation (Rth)" is calculated by Equation B and they are measured at a wavelength of 550 nm:

$$Re=(nx-ny)\times d \qquad <\text{Equation A}>$$

$$Rth=((nx+ny)/2-nz)\times d \qquad <\text{Equation B}>$$

(In Equation A, Equation B, wherein nx, ny, and nz are refractive index at a wavelength of 550 nm in the x-axis direction, the y-axis direction and the z-axis direction of an optical film, respectively, and d is the thickness of the optical film (unit: nm)).

As used herein, the term "light emitting device" includes an organic or inorganic light emitting device and can mean a light emitting diode (LED), an organic light emitting diode (OLED), a quantum dot light emitting diode (QLED), and other devices including light emitting materials such as fluorescers.

As used herein, the "first protective layer" may have Re of 10 nm or less at a wavelength of 550 nm.

As used herein, "as" and "bs" of a polarizing plate are color values of the polarizing plate and can be measured using a V-7100 (JASCO) at a wavelength of 550 nm.

As used herein, the term "color temperature" is a color value of light measured by a luminance colorimeter and is represented in kelvin (absolute temperature, K), and a higher color temperature approaches a blue color and a lower color temperature approaches a red color. Color temperature represents the color of light emitted from a black body, which exhibits different colors depending on the type of light. When a standard black body is burnt and the temperature of the black body reaches a certain temperature, the surface of the black body emits light and the color thereof gradually changes to dark red-yellow-white-blue colors. With such characteristics of color change, when a color of a light source is the same as the color of the black body, the absolute temperature of the black body is referred to as the color temperature of the light source. Since a spectrum of an actual light source differs from the spectrum of the black body, the color temperature of the black body near the color coordinate of the light source is defined as the color temperature of the light source.

As used herein, "substituted" in "substituted or unsubstituted" means that at least one hydrogen atom in a functional group is substituted with a $C_1$ to $C_{10}$ alkyl group, a hydroxyl group, a $C_3$ to $C_{10}$ cycloalkyl group, a $C_6$ to $C_{10}$ aryl group, a $C_7$ to $C_{10}$ arylalkyl group, or an amino group.

Hereinafter, a polarizing plate according to one embodiment of the present invention will be described with reference to FIG. 1.

Figure 1:
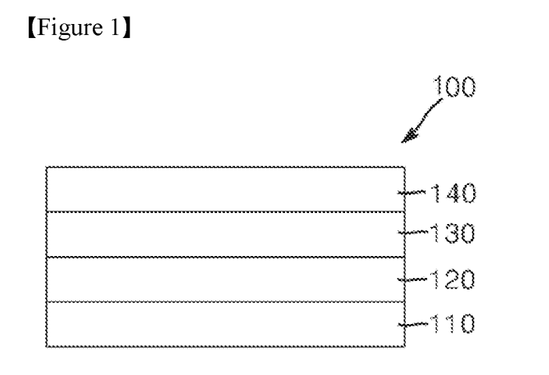
FIG. 1 is a cross-sectional view of a polarizing plate according to one embodiment of the present invention.

Referring to FIG. 1, a polarizing plate 100 according to one embodiment may include a first adhesive film 110, a second protective layer 120, a polarizer 130, and a first protective layer 140, and may contain a UV absorber described below.

FIG. 1 shows the polarizing plate 100 in which the UV absorber is contained in the first adhesive film 110. Alternatively, the UV absorber may be contained in at least one of the first protective layer 140, the second protective layer 120, and the polarizer 130 as well as the first adhesive film 110. That is, according to the present invention, the UV absorber may be contained in at least one of the first adhesive film, the first protective layer, the second protective layer, the polarizer, and a second adhesive film described below.

First Adhesive Film

The first adhesive film 110 can adhere the polarizing plate 100 to a display device such as a light emitting device.

Since the first adhesive film 110 contains the UV absorber described below, the polarizing plate 100 may have an as value of about −2.0 to about −20.0 and a bs value of about 3.0 to about 30.0. Within this range, the polarizing plate can block UV light when stacked on the light emitting device and can have a color applicable to a light emitting display. When the color value of the polarizing plate is out of this range, the polarizing plate becomes too yellowish to be applicable to the light emitting display or cannot absorb UV light, thereby causing degradation in lifespan of the light emitting device. In addition, the polarizing plate according to this embodiment absorbs and blocks light having a wavelength of 420 nm or less to prevent damage to the light emitting device to which the polarizing plate according to this embodiment is applied, thereby improving external light stability and lifespan of the light emitting device. For example, the polarizing plate according to this embodiment may have an as value of about −2.0, about −3.0, about −4.0, about −5.0, about −6.0, about −7.0, about −8.0, about −9.0, about −10.0, about −11.0, about −12.0, about −13.0, about −14.0, about −15.0, about −16.0, about −17.0, about −18.0, about −19.0, or about −20.0. For example, the polarizing plate according to this embodiment may have a bs value of about 3.0, about 4.0, about 5.0, about 6.0, about 7.0, about 8.0, about 9.0, about 10.0, about 11.0, about 12.0, about 13.0, about 14.0, about 15.0, about 16.0, about 17.0, about 18.0, about 19.0, about 20.0, about 21.0, about 22.0, about 23.0, about 24.0, about 25.0, about 29.0, or about 30.0.

Specifically, the polarizing plate according to this embodiment may have a light transmittance of about 30% or less at a wavelength of 420 nm or less. More specifically, the polarizing plate according to this embodiment may have a light transmittance of about 0% to about 30% at a wavelength of 400 nm to 420 nm, 400 nm, 405 nm, 410 nm, 415 nm, or 420 nm, for example, about 0%, about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, or about 30%. Within this range, the polarizing plate can increase lifespan of the light emitting device by suppressing damage to the light emitting device. The effect of suppressing damage to the light emitting device can be confirmed through reduction in the color temperature variation rate upon UV irradiation of the light emitting device. As used herein, the term "light transmittance" means an average transmittance at a certain wavelength or in a certain wavelength range.

In the first adhesive film 110, the UV absorber may be present in an amount of about 0.1 wt % to about 2 wt %, specifically about 0.1 wt % to about 1.5 wt %, more specifically about 0.1 wt % to about 1.45 wt %, or 0.10 wt % to 1.40 wt %, for example, about 0.1 wt %, about 0.2 wt %, 0.4 wt %, 0.8 wt %, 1.0 wt %, 1.2 wt %, or 1.4 wt %. Within this range, the polarizing plate according to this embodiment may have a light transmittance of 30% or less at a wavelength of 420 nm or less. Obviously, the UV absorber may be contained, in an amount as set forth above, in at least one of the first adhesive film, the first protective layer, the polarizer, and the second protective layer.

The first adhesive film contains the UV absorber described below to prevent damage to the light emitting device and degradation in lifespan thereof by external light. These effects can be confirmed by the color temperature variation rate of the light emitting display. This will be described in detail below.

The first adhesive film 110 may have a thickness of about 3 μm to about 80 μm, for example, about 5 μm to about 50 μm. Within this thickness range, the first adhesive film can be used for the light emitting display.

The first adhesive film 110 may be formed by coating an adhesive composition for polarizing plates to a predetermined thickness, followed by aging. Hereinafter, the adhesive composition for polarizing plates will be described.

The adhesive composition for polarizing plates contains a UV absorber, a (meth)acrylic copolymer, and a curing agent.

The UV absorber is an indole compound, as represented by Formula 1:

<Formula 1>

(In Formula 1, wherein $R^1$ is hydrogen or a substituted or unsubstituted $C_1$ to $C_{10}$ alkyl group,

$R^2$ is hydrogen or a substituted or unsubstituted $C_6$ to $C_{20}$ aryl group, $R^3$ is hydrogen or a substituted or unsubstituted $C_1$ to $C_{10}$ alkyl group,

$R^4$ is hydrogen, a cyano group (CN), or a substituted or unsubstituted $C_1$ to $C_{10}$ alkyl group, and $R^5$ is a cyano group or —(C=O)O—$R^6$ ($R^6$ being a substituted or unsubstituted $C_1$ to $C_{10}$ alkyl group or a substituted or unsubstituted $C_6$ to $C_{20}$ aryl group).

Specifically, $R^1$ is a $C_1$ to $C_5$ alkyl group, specifically a methyl group, $R^2$ is a $C_6$ to $C_{10}$ aryl group, specifically a phenyl group, $R^3$ is hydrogen or a $C_1$ to $C_5$ alkyl group, specifically hydrogen, $R^4$ is a cyano group, and $R^5$ is a cyano group or —(C=O)—O—$R^6$ ($R^6$ being a substituted or unsubstituted $C_1$ to $C_5$ alkyl group). More specifically, the compound represented by Formula 1 may include a compound represented by Formula 1-1 or Formula 1-2.

<Formula 1-1>

<Formula 1-2>

The compound represented by Formula 1 may have a melting point of about 100° C. or more, specifically about 140° C. to about 220° C., for example, about 140° C., about 150° C., about 160° C., about 170° C., about 180° C., about 190° C., about 200° C., about 210° C., or about 220° C., and may have a solid phase at room temperature.

The compound represented by Formula 1 may be prepared by a typical method known to those skilled in the art or may be selected from commercially available products.

The compound represented by Formula 1 may have an absorbance of about 0.8 AU or more, specifically about 0.8 AU to about 1.0 AU, for example, about 0.8 AU, about 0.9 AU, or about 1.0 AU as measured at a wavelength of 390 nm in 10 mg/L of chloroform (path 1 cm), and a maximum absorption wavelength of higher than about 390 nm, specifically higher than about 390 nm to about 400 nm, more specifically higher than about 390 nm to less than about 400 nm. Within these ranges, the adhesive composition for polarizing plates can reduce transmittance by sufficiently absorbing external light at a wavelength of 420 nm or less, specifically 400 nm to 420 nm, thereby improving external light stability of the light emitting device. Herein, the "maximum absorption wavelength" means a wavelength at which the highest absorption peak appears, that is, a wavelength at which the highest absorption peak appears in an absorbance curve depending upon wavelength. Herein, the "absorbance" can be measured by a typical method known to those skilled in the art.

The UV absorber may be present in an amount of about 0.05 parts by weight to about 1.45 parts by weight, specifically about 0.05 parts by weight to about 1 part by weight, for example, about 0.05 parts by weight, about 0.10 parts by weight, about 0.20 parts by weight, about 1.00 parts by weight, about 1.15 about 1.2 parts by weight, about 1.25 parts by weight, about 1.30 parts by weight, about 1.35 parts by weight, about 1.40 parts by weight, or about 1.45 parts by weight, relative to 100 parts by weight of the (meth)acrylic copolymer described below. Within this range, the polarizing plate may have a light transmittance of 30% or less at a wavelength of 420 nm or less, an as value of −2.0 to −20.0, and a bs value of 3.0 to 30.0. More advantageously, the UV absorber may be present in an amount of 1.45 parts by weight or less.

The (meth)acrylic copolymer may include an alkyl group-containing (meth)acrylate; and at least one of a hydroxyl group-containing (meth)acrylate, a carboxylic acid group-containing monomer, an aromatic group-containing monomer, an alicyclic group-containing monomer, and a hetero-alicyclic group-containing monomer.

The alkyl group-containing (meth)acrylate is an unsubstituted $C_1$ to $C_{20}$ alkyl group-containing (meth)acrylate, and may include at least one selected from among methyl (meth)acrylate, ethyl (meth)acrylate, propyl (meth)acrylate, n-butyl (meth)acrylate, t-butyl (meth)acrylate, iso-butyl (meth)acrylate, pentyl (meth)acrylate, hexyl (meth)acrylate, 2-ethylhexyl (meth)acrylate, heptyl (meth)acrylate, octyl (meth)acrylate, iso-octyl (meth)acrylate, nonyl (meth)acrylate, and decyl (meth)acrylate, without being limited thereto. These may be used alone or as a mixture thereof. The alkyl group-containing (meth)acrylate may be present in an amount of about 65 wt % to about 99 wt %, specifically about 90 wt % to about 99 wt %, in the monomer mixture. Within this content range, the alkyl group-containing (meth)acrylate can secure mechanical strength and good adhesion of an adhesive film.

The hydroxyl group-containing (meth)acrylate may include a $C_1$ to $C_{20}$ alkyl group-containing, a $C_3$ to $C_{10}$ cycloalkyl group-containing or a $C_6$ to $C_{20}$ aryl group-containing (meth)acrylate having at least one hydroxyl group. Specifically, the hydroxyl group-containing (meth)acrylate may include at least one selected from among 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, 1,4-cyclohexanedimethanol mono(meth)acrylate, 1-chloro-2-hydroxypropyl(meth)acrylate, diethylene glycol mono(meth)acrylate, 2-hydroxy-3-phenyloxypropyl (meth)acrylate, 4-hydroxycyclopentyl (meth)acrylate, and 4-hydroxycyclohexyl (meth)acrylate. These may be used alone or as a mixture thereof. The hydroxyl group-containing (meth)acrylate may be present in an amount of about 1 wt % to about 35 wt % specifically about 1 wt % to about 10 wt %, in the monomer mixture. Within this content range, the adhesive film can exhibit a high degree of crosslinking and good adhesion to a protective film.

The carboxylic acid group-containing monomer may include at least one selected from among (meth)acrylic acid, 2-carboxyethyl (meth)acrylate, 3-carboxypropyl (meth)acrylate, 4-carboxybutyl (meth)acrylate, itaconic acid, crotonic acid, maleic acid, fumaric acid, and maleic anhydride, without being limited thereto. These may be used alone or in combination thereof. The carboxylic acid group-containing monomer may be optionally present in an amount of about 0 wt % to about 5 wt %, specifically about 1.5 wt % to about 2.5 wt %, in the monomer mixture. Within this content range, the adhesive film can exhibit a high degree of crosslinking and good adhesion to a protective film.

The alicyclic group-containing monomer may include a $C_3$ to $C_{10}$ alicyclic group-containing (meth)acrylate, specifically cyclohexyl (meth)acrylate, isobornyl (meth)acrylate, and the like.

The hetero-alicyclic group-containing monomer may include a (meth)acrylate containing a $C_2$ to $C_{10}$ hetero-alicyclic group having nitrogen, oxygen or sulfur, specifically (meth)acryloylmorpholine.

The (meth)acrylic copolymer may have a weight average molecular weight (Mw) of about 1,300,000 or less, specifically about 900,000 to about 1,300,000. Within this range, the adhesive film can exhibit good durability. The weight average molecular weight can be measured by gel permeation chromatography with a polystyrene standard. The (meth)acrylic copolymer may have a glass transition temperature of about −80° C. to about −10° C., specifically about −75° C. to about −20° C. Within this range of glass transition temperature, the (meth)acrylic copolymer can provide good adhesive properties by securing good wettability. The (meth)acrylic copolymer may have a polydispersion index of about 2.0 to about 10.0, specifically about 3.0 to about 7.0. Within this range of polydispersion index, the (meth)acrylic copolymer can significantly reduce curing time while securing durability under high temperature conditions. The (meth)acrylic copolymer may have an acid value of about 5.0 mgKOH/g or less, more specifically about 0.1 mgKOH/g to about 3.0 mgKOH/g. Within this range of acid value, the (meth)acrylic copolymer can directly or indirectly suppress corrosion of an adherend.

The (meth)acrylic copolymer may be prepared by typical polymerization of the monomer mixture. Polymerization of the monomer mixture may be performed by a typical method known to those skilled in the art. For example, the (meth) acrylic copolymer may be prepared by adding an initiator to the monomer mixture, followed by typical polymerization of the monomer mixture, for example, suspension polymerization, emulsion polymerization, solution polymerization, and the like. Here, the polymerization may be performed at about 65° C. to about 70° C. for about 6 hours to about 8 hours. As the initiator, any typical initiator including azo-based polymerization initiators and/or peroxide polymerization initiators such as benzoyl peroxide or acetyl peroxide may be used.

The curing agent is a polyfunctional curing agent and may include at least one of, for example, an isocyanate-based curing agent, a metal chelate-based curing agent, an epoxy-based curing agent, an amine-based curing agent, and a carbodiimide-based curing agent. Specifically, the isocyanate-based curing agent may include a bi- or higher functional, for example, a tri- to hexa-functional isocyanate-based curing agent to facilitate increase in modulus and gel fraction of the adhesive film. Specifically, the isocyanate-based curing agent may include at least one of trifunctional isocyanate-based curing agents including tri-functional trimethylolpropane modified toluene diisocyanate adducts, tri-functional toluenediisocyanate trimers, and trimethylolpropane modified xylene diisocyanate adducts, hexa-functional trimethylolpropane modified toluene diisocyanate, and hexa-functional isocyanurate modified toluenediisocyanate. These may be used alone or in combination thereof.

The curing agent may be present in an amount of about 0.1 to about 20 parts by weight, specifically about 1 to about 10 parts by weight, relative to 100 parts by weight of the (meth)acrylic copolymer. Within this range, the curing agent can reduce the swelling degree of the adhesive film by improving the crosslinking degree thereof.

The adhesive composition for polarizing plates may further include a silane coupling agent. The silane coupling agent can improve adhesion to the adhesive film with respect to an adherend such as glass. The silane coupling agent may include a typical silane coupling agent known to those skilled in the art. For example, the silane coupling agent may include at least one selected from the group consisting of an epoxy structure-containing silicon compound, such as 3-glycidoxypropyltrimethoxysilane, 3-glycidoxypropyltriethoxysilane, 3-glycidoxypropylmethyldimethoxysilane, and 2-(3,4-epoxycyclohexyl)ethyltrimethoxysilane; a polymerizable unsaturated group-containing silicon compound, such as vinyltrimethoxysilane, vinyltriethoxysilane, and (meth)acryloxypropyl trimethoxysilane; an amino group-containing silicon compound, such as 3-aminopropyltrimethoxysilane, 3-am inopropyltriethoxysilane, N-(2-aminoethyl)-3-am inopropyltrimethoxysilane, and N-(2-aminoethyl)-3-aminopropylmethyldimethoxysilane; and 3-chloropropyltrimethoxysilane, without being limited thereto.

The silane coupling agent may be present in an amount of about 0.01 parts by weight to about 5 parts by weight, specifically about 0.02 parts by weight to about 1 parts by weight relative to 100 parts by weight of the (meth)acrylic copolymer. Within this range, the adhesive composition can provide good adhesion performance while securing good durability.

In addition to the compound represented by Formula 1, the adhesive composition for polarizing plates may further include at least one of benzotriazole, benzophenone, triazine, and benzimidazole as the UV absorber. Details of these UV absorbers are well known to those skilled in the art.

The adhesive composition for polarizing plates may further include typical additives. The additives may include antistatic agents, antioxidants, tackifiers, plasticizers, and the like. The adhesive composition for polarizing plates may have a viscosity at 25° C. of about 500 cPs to about 2,500 cPs. Within this range, the adhesive film allows easy thickness adjustment, does not suffer from spots, and can provide uniform coating.

Polarizer

The polarizer 130 may be formed on the second protective layer 120 to polarize external light or internal light. The polarizer 130 may include a polyvinyl alcohol polarizer produced by dyeing a polyvinyl alcohol film with iodine or the like. For example, the polyvinyl alcohol polarizer is produced by dyeing the polyvinyl alcohol film with iodine or dichroic dyes, followed by stretching the polyvinyl alcohol film in one direction. Specifically, the polyvinyl alcohol polarizer is produced through swelling, dyeing, and stretching. Methods for performing these processes are well known in the art. The polarizer 130 may have a thickness of about 5 μm to about 50 μm. Within this thickness range, the polarizer can be used in a light emitting display.

First Protective Layer

The first protective layer 140 may be formed on the polarizer 130 to protect the polarizer 130 while improving mechanical strength of the polarizing plate.

The first protective layer 140 may include at least one of an optically transparent protective film or a protective coating layer.

When the first protective layer 140 is a protective film, the first protective layer 140 may include a protective film formed of an optically transparent resin. The protective film may be formed by melt extrusion of the resin. As needed, a stretching process may be further performed. The resin may include at least one selected from among cellulose ester resins including triacetylcellulose and the like, cyclic polyolefin resins including amorphous cyclic olefin polymer (COP) and the like, polycarbonate resins, polyester resins including polyethylene terephthalate (PET) and the like, polyethersulfone resins, polysulfone resins, polyamide resins, polyimide resins, non-cyclic-polyolefin resins, polyacrylate resins including poly(methyl methacrylate) and the like, polyvinyl alcohol resins, polyvinyl chloride resins, and polyvinylidene chloride resins.

When the first protective layer 140 is a protective coating, the first protective layer 140 can improve adhesion with respect to the polarizer 130, transparency, mechanical strength, thermal stability, moisture blocking performance, and durability. In one embodiment, the protective coating for the first protective layer 140 may be formed of an active-energy ray curable resin composition, which includes an active-energy ray curable compound and a polymerization initiator.

The active energy-ray curable compound may include at least one selected from among a cationic polymerizable curable compound, a radical polymerizable curable compound, a urethane resins, and a silicone resin. The cationic polymerizable curable compound may include at least one of an epoxy compound containing at least one epoxy group therein and an oxetane compound containing at least one oxetane ring therein. The radical polymerizable curable compound may be a (meth)acrylic compound having at least one (meth)acryloyloxy group therein.

The epoxy compound may include at least one selected from among hydrogenated epoxy compounds, aliphatic epoxy compounds, alicyclic epoxy compounds, and aromatic epoxy compounds.

The radical polymerizable curable compound can realize a protective coating layer that exhibits excellent properties in terms of hardness, mechanical strength and durability. The radical polymerizable curable compound may be obtained by reacting a (meth)acrylate monomer having at least one (meth)acryloyloxy group with two or more types of functional group-containing compounds, and may include a (meth)acrylate oligomer which has at least two (meth)acryloyloxy groups therein.

Examples of the (meth)acrylate monomer include a monofunctional (meth)acrylate monomer having a single (meth)acryloyloxy group, a bifunctional (meth)acrylate monomer having two (meth)acryloyloxy groups, and a polyfunctional (meth)acrylate monomer having three or more (meth)acryloyloxy groups.

The (meth)acrylate oligomer may include a urethane (meth)acrylate oligomer, a polyester (meth)acrylate oligomer, an epoxy (meth)acrylate oligomer, and the like.

The polymerization initiator can cure the active-energy ray curable composition. The polymerization initiator may include at least one of a photo-cationic polymerization initiator and a photosensitizer.

As the photo-cationic polymerization initiator, any typical photo-cationic polymerization initiator known to those skilled in the art may be used. Specifically, the photo-cationic polymerization initiator may include an onium salt containing a cation and an anion. Examples of the cation may include: diaryliodonium such as diphenyliodonium, 4-methoxydiphenyliodonium, bis(4-methylphenyl)iodonium, bis(4-tert-butylphenyl)iodonium, bis(dodecylphenyl)iodonium and (4-methylphenyl)[(4-(2-methylpropyl)phenyl)iodonium; triarylsulfonium such as triphenylsulfonium and diphenyl-4-thiophenoxyphenylsulfonium; bis[4-(diphenylsulfonio)-phenyl]sulfide, and the like. Examples of the anion may include hexafluorophosphate ($PF_6^-$), tetrafluoroborate ($BF_4^-$), hexafluoroantimonate ($SbF_6^-$), hexafluoroarsenate ($AsF_6^-$), hexachloroantimonate ($SbCl_6^-$), and the like.

As the photosensitizer, any typical photosensitizer known to those skilled in the art may be used. Specifically, the photosensitizer may include at least one of thioxanthone, phosphorus, triazine, acetophenone, benzophenone, benzoin, and oxime photosensitizers.

The polymerization initiator may be present in an amount of about 0.01 parts by weight to about 10 parts by weight relative to 100 parts by weight of the active energy-ray curable compound. Within this range, the polymerization initiator can secure sufficient curing of the adhesive composition to provide high mechanical strength and good adhesion to the polarizer.

The active energy ray-curable resin composition may further include typical additives such as a silicone leveling agent, a UV absorbent, an antistatic agent, and the like. The additives may be present in an amount of 0.01 parts by weight to about 1 part by weight based on 100 parts by weight of the active energy ray-curable compound.

The first protective layer 140 may have a thickness of about 5 µm to about 200 µm, specifically about 30 µm to about 120 µm. The first protective layer 140 may have a thickness of about 50 µm to about 100 µm when realized by the protective film and a thickness of about 5 µm to about 50 µm when realized by the protective coating layer. Within this thickness range, the first protective layer can be used in a light emitting display.

Although not shown in FIG. 1, functional layers such as a hard coating layer, an anti-fingerprint layer, an anti-reflection layer, and the like may be further formed on an upper surface of the first protective layer 140.

In addition, although not shown in FIG. 1, in the structure wherein the first protective layer 140 is realized by the protective film, a bonding layer may be further formed between the first protective layer 140 and the polarizer 130. The bonding layer may be formed of a typical bonding agent for polarizing plates, for example, a water-based bonding agent, a photocurable bonding agent, and a pressure sensitive bonding agent.

In addition, FIG. 1 shows the structure wherein the UV absorber is contained in the first adhesive film. In some embodiments, the polarizing plate may further include an adhesive film formed on the first protective layer 140 shown in FIG. 1 and the adhesive film may include the UV absorber. The adhesive film can adhere the polarizing plate to various devices of an optical display. In one embodiment, the adhesive film may include an optically clear adhesive (OCA) and may include the UV absorber.

Second Protective Layer

The second protective layer 120 may be formed on the first adhesive film 110 to protect the polarizer 130 while improving mechanical strength of the polarizing plate.

The second protective layer 120 may be optically transparent. Specifically, the second protective layer 120 may have a total light transmittance of about 90% or more, specifically about 90% to about 100%, in the visible range. Although FIG. 1 shows the structure wherein the second protective layer 120 is composed of a single layer, the second protective layer 120 may be composed of multiple layers.

The second protective layer 120 may include at least one of the protective film and the protective coating layer described in the first protective layer 140, and may have the same thickness, material, and the like as the first protective layer 140. Alternatively, the second protective layer 120 may be a retardation film. When the second protective layer 120 is a retardation film, visibility of the polarizing plate can be improved.

The second protective layer 120 may include the same protective film or protective coating layer as the first protective layer and may further include a retardation film to improve visibility of the polarizing plate. In one embodiment, the retardation film may be a first retardation film, for example, a quarter wave plate (λ/4 retardation film, QWP), which has an Re of about 100 nm to about 220 nm, more specifically about 100 nm to about 180 nm, at a wavelength of 550 nm. In another embodiment, the retardation film may be a second retardation film, for example, a half wave plate (λ/2 retardation film, HWP), which has an Re of about 225 nm to about 350 nm, more specifically about 225 nm to about 300 nm, at a wavelength of 550 nm. The first retardation film or the second retardation film may be used alone or as a stack film thereof. Within this range, when used in a light emitting display that includes a light emitting device, the second protective layer can reduce lateral color shift.

The retardation film can provide an optical compensation effect when used on a polarizing plate, and may be an optically transparent resin film or a liquid crystal film.

In one embodiment, the retardation film may be a resin film formed of an optically transparent resin. The resin may include the resin described in the first protective layer described above, or may include a film produced through modification of the above resin. The modification may include copolymerization, branching, cross-linking, or inclusion of heterologous molecules, without being limited thereto. In this case, the retardation film may be the same or different from the first protective layer 140 in terms of thickness, material, and the like.

In another embodiment, the retardation film may be an optically transparent liquid crystal film. In a further embodiment, the retardation film may be a liquid crystal coating layer. The liquid crystal film and the liquid crystal coating layer may be formed of a liquid crystal composition. The liquid crystal composition exhibits liquid crystallinity and examples of the liquid crystal may include a nematic liquid crystal phase, a smectic liquid crystal phase, a cholesteric liquid crystal phase, and a cylindrical liquid crystal phase. The liquid crystal compound may be either a temperature-transfer liquid crystal in which a liquid crystal phase is expressed according to temperature change, or a concentration-transfer liquid crystal in which a liquid crystal phase is expressed according to concentration of a solute in a solution state. The liquid crystal composition includes a liquid crystal compound, and may be present in an amount of about 40 parts by weight to about 100 parts by weight with respect to 100 parts by weight of the liquid crystal composition in terms of solid content. The liquid crystal composition may further contain a chiral agent to obtain a film having a desired refractive index. The liquid crystal composition may further include additives such as leveling agents, polymerization initiators, alignment aids, heat stabilizers, lubricants, plasticizers, and antistatic agents. The liquid crystal film or liquid crystal coating layer may have a thickness of about 1 µm to about 100 µm, specifically about 1 µm to about 50 µm, more specifically about 1 µm to about 10 µm. Within this range, the liquid crystal film or liquid crystal coating layer can be used in an optical display.

The second protective layer 120 may include at least one of the protective film (or protective coating layer) and the retardation film.

In one embodiment, the second protective layer may be the retardation film.

In another embodiment, the second protective layer may be a stack film of the retardation film and the protective film (or protective coating layer), in which the first adhesive film 110, the retardation film, a polarizer 130, and first protective layer 140 are sequentially stacked in the stated order. Preferably, the retardation film may be the first retardation film.

In a further embodiment, the second protective layer may be a stack film of two types of the retardation films described above.

In yet another embodiment, the second protective layer may be a stack film of stack film of the retardation film and the protective film (or protective coating layer), in which the first adhesive film 110, the stack of the retardation films, the protective film (or protective coating layer), the polarizer 130, and the first protective layer 140 are sequentially stacked in the stated order. The stack of the retardation films may be a stack film of the first retardation film and the second retardation film, and improves visibility.

Each of the retardation film and the protective film (or protective coating layer) may be stacked on another film via a second adhesive film. The second adhesive film may be formed of the adhesive composition described above and may include or be free from the UV absorber represented by Formula 1 or a typical UV absorber. Preferably, the polarizing plate may include the first adhesive film, the first retardation film, the second adhesive film, the second retardation film, the polarizer, and the first protective layer sequentially stacked in the stated order. The UV absorber represented by Formula 1 may be contained in the second adhesive film. When the UV absorber of Formula 1 is interposed between the first retardation film and the second retardation film, interface reflectivity can be increased due to a high index of refraction of the first retardation film and an optical path can be formed in the second adhesive film containing the UV absorber, thereby providing the most efficient UV absorption. Obviously, the UV absorber represented by Formula 1 may or may not be contained in the first adhesive film.

The second adhesive film may have a thickness of about 1 μm to about 80 μm, for example, about 1 μm to about 30 μm, about 2 μm to about 20 μm, about 3 μm to about 15 μm, or about 1 μm to about 15 μm. Within this range, the second adhesive film can be used in a light emitting display.

Although FIG. 1 shows the structure wherein the UV absorber is contained in the first adhesive film 110, the UV absorber may also be contained in the second protective layer 120, the polarizer 130, or the first protective layer 140. Further, the UV absorber may be contained in the first adhesive film 110; and at least one of the second protective layer 120, the polarizer 130, and the first protective layer 140.

Figure 2:
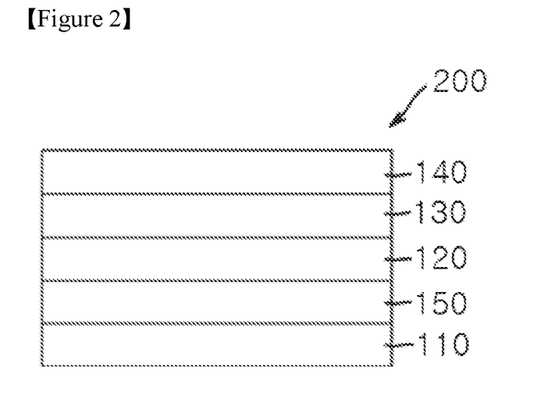
FIG. 2 is a cross-sectional view of a polarizing plate according to another embodiment of the present invention.

Next, a polarizing plate according to another embodiment of the present invention will be described with reference to FIG. 2. FIG. 2 is a cross sectional view of a polarizing plate according to another embodiment of the present invention.

Referring to FIG. 2, a polarizing plate 200 according to another embodiment of the invention is substantially the same as the polarizing plate 100 according to the above embodiment except that a positive C plate 150 is interposed between the first adhesive film 110 and the second protective layer 120. The positive C plate 150 serves to improve lateral visibility.

The positive C plate 150 is formed on the first adhesive film 110 to resolve a lateral color shift phenomenon by which a reflection color varies depending upon a lateral direction in a polarizing plate in which the absorption axis of the polarizer 130 is slanted with respect to the optical axis of the second protective layer 120.

The positive C plate 150 is a positive uniaxial optical device satisfying a refractive index distribution of nz>nx=ny, and has an Re of about 5 nm or less at a wavelength of 550 nm, specifically about 0 nm to about 5 nm, and an Rth of about −60 nm or less at a wavelength of 550 nm, specifically about −300 nm to about −60 nm. Within these ranges, the positive C plate 150 can suppress deterioration in black visibility at the lateral side, thereby improving lateral viewing angle. The positive C plate 150 may have a thickness of about 1 μm to about 80 μm, for example, about 1 μm to about 60 μm, more specifically about 1 μm to about 40 μm. Within this thickness range, the positive C plate 150 can be used in a light emitting display. The positive C plate 150 is optically transparent and may be formed of the resin described above or may be obtained by curing the liquid crystal composition containing the liquid crystal compound described above. The positive C plate 150 and the second protective layer 120 may be stacked via a second adhesive film.

FIG. 2 shows the structure wherein the positive C plate 150 is interposed between the first adhesive film 110 and the second protective layer 120. In alternative embodiments, the positive C plate 150 may be formed on a lower surface of the first adhesive film 110. That is, the positive C plate 150, the first adhesive film 110, the second protective layer 120, the polarizer 130, the first protective layer 140 may be sequentially stacked in the stated order. In this embodiment, a second adhesive film or a first adhesive film may be formed on a lower surface of the positive C plate. Obviously, the positive C plate may also include the UV absorber.

A light emitting display according to one embodiment of the invention may include the polarizing plate according to the embodiments of the invention. For example, the light emitting display may include an organic light emitting display, without being limited thereto.

Next, the light emitting display according to the embodiment of the invention will be described with reference to FIG. 3.

Figure 3:
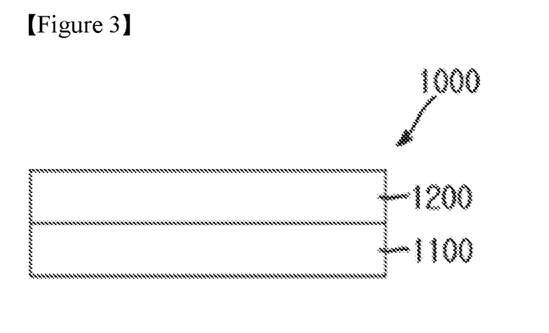
FIG. 3 is cross-a sectional view of a light emitting display according to one embodiment of the present invention.

Referring to FIG. 3, a light emitting display 1000 according to one embodiment of the invention may include a light emitting display unit 1100 and a polarizing plate 1200 stacked on the light emitting display unit 1100, wherein the polarizing plate 1200 may include the polarizing plate according to the embodiments of the invention.

Light Emitting Display Unit

The light emitting display unit 1100 serves to drive the light emitting display 1000 and may include a light emitting device. The light emitting device includes an organic or organic-inorganic light emitting device, and may include a light emitting diode (LED), an organic light emitting diode (OLED), a quantum dot light emitting diode (QLED), and light emitting materials such as phosphors. In one embodiment, the light emitting device may include an organic light emitting diode. The organic light emitting diode is a self-emissive device and may include a first electrode, an organic light emitting layer, and a second electrode sequentially stacked in the stated order. The organic light emitting diode may include a rear emission structure in which light generated in the organic emission layer is emitted through a bottom substrate, or an upper emission structure in which light generated in the organic emission layer is emitted through an upper substrate. The light emitting display unit may further include at least one of a lower substrate, a thin film transistor, a planarization layer, a protective film, and an insulation film, in addition to the organic light emitting device.

Polarizing Plate

The polarizing plate 1200 may be formed on the light emitting display unit 1100 to act as an antireflection film in order to prevent deterioration in visibility of the light emitting display by reflecting external light entering the light emitting display.

The polarizing plate 1200 may include the polarizing plate according to the embodiments described above. Preferably, the polarizing plate 1200 may be adhered to the light emitting display unit 1100 by the first adhesive film of the polarizing plate.

With the UV absorber contained in the first adhesive film, the light emitting display 1000 according to this embodiment can prevent damage to the light emitting device and degradation in lifespan thereof due to external light and can efficiently block UV light even under severe conditions to prevent damage to the light emitting device and degradation in lifespan thereof. Variation in the lifespan of the light emitting device by UV irradiation can be determined based on the color temperature variation rate of a light emitting display. A lower color temperature variation rate upon UV irradiation under severe conditions indicates a longer lifespan of the light emitting device. The light emitting display 1000 according to this embodiment has a color temperature variation rate of about 40% or less, more specifically about 0% to about 35%, as calculated by the following Formula 1, thereby improving the lifespan of the light emitting device upon UV irradiation even under severe conditions. The color temperature variation rate was calculated as an absolute value.

Color temperature variation rate=$(CT_1-CT_2)/CT_1 \times 100$, <Equation 1>

(In Equation 1, wherein $CT_1$ is an initial color temperature (unit: K) of the light emitting display, and $CT_2$ is the color temperature (unit: K) of the light emitting display, as measured after irradiating the light emitting display with UV light under conditions of 63° C., a wavelength of 340 nm and 0.32 W/m² for 500 hours.)

Next, the constitution and effects of the present invention will be described in more detail with reference to some examples. It should be understood that these examples are provided for illustration only and are not to be construed in any way as limiting the present invention.

Example 1

In a 1 L reactor equipped with a cooler for temperature regulation and kept in a nitrogen atmosphere, 100 parts by weight of a monomer mixture comprising 99 parts by weight of n-butyl acrylate (BA) and 1 part by weight of 2-hydroxyethyl methacrylate (2-HEMA) was prepared. 60 parts by weight of ethyl acetate and 25 parts by weight of methylethylketone were added, as solvents, to the monomer mixture. After purging the reactor containing the monomer mixture with nitrogen at 65° C. for 30 minutes, 0.04 parts by weight of azobisisobutyronitrile (AIBN) diluted with 2 parts by weight of ethyl acetate was added as an initiator thereto. With the reactor kept at 65° C., reaction was performed for 6 hours, followed by additional reaction at 70° C. for 2 hours. After completion of reaction, 130 parts by weight of ethyl acetate was added to the mixture, thereby preparing a methacrylic copolymer solution.

20 parts by weight of methylethylketone was added, as a solvent, to 100 parts by weight of the methacrylic copolymer, followed by adding 5 parts by weight of an isocyanate-based curing agent (L-45, Soken), 0.1 parts by weight of a silane coupling agent (KBE-403, Shin-Etsu Chemical), and 0.2 parts by weight of the compound represented by Formula 1-1, as a UV absorber, thereby preparing an adhesive composition. The compound represented by Formula 1-1 had an absorbance of 0.8 AU, as measured at a wavelength of 390 nm in 10 mg/L of chloroform (path 1 cm), a maximum absorption wavelength of 391 nm, and a solid phase (yellow powder). ¹H NMR data of the compound represented by Formula 1-1 was as follows: ¹H NMR (300 MHz, Methylene Chloride-d2) 8.52-8.40 (m, 1H), 8.22-8.13 (s, 1H), 7.71-7.65 (m, 1H), 7.71-7.61 (m, 2H), 7.56-7.50 (m, 1H), 7.48-7.44 (m, 2H), 7.47-7.41 (m, 1H), 7.47-7.44 (m, 1H), 4.51-4.15 (m, 2H), 3.86-3.64 (s, 3H), 1.44-1.33 (m, 3H).

<Formula 1-1>

Example 2 to Example 6

Adhesive composition of Example 2 to Example 6 was prepared by the same method as in Example 1 except that the compound represented by Formula 1-1 was used in amounts of 0.5 parts by weight, 0.8 parts by weight, 1.0 parts by weight, 1.2 parts by weight, and 1.4 parts by weight, respectively.

Comparative Example 1

An adhesive composition was prepared by the same method as in Example 1 except that the compound represented by Formula 1-1 was not used.

Comparative Example 2

An adhesive composition was prepared by the same method as in Example 1 except that 0.5 parts by weight of a benzophenone absorber (Tinuvin 531, BASF) was used instead of the compound represented by Formula 1-1.

Comparative Example 3

An adhesive composition was prepared by the same method as in Example 1 except that 0.5 parts by weight of a triazole absorber (Tinuvin 384-2, BASF) was used instead of the compound represented by Formula 1-1.

Comparative Example 4

An adhesive composition was prepared by the same method as in Example 1 except that 0.5 parts by weight of a triazine absorber (Tinuvin 477, BASF) was used instead of the compound represented by Formula 1-1.

Polarizing plates including adhesive films produced from the adhesive compositions prepared in Examples and Comparative Examples were evaluated as to the following properties and results are shown in Table 1.

Preparation of Polarizing Plate

A polarizer was prepared by stretching a polyvinyl alcohol film to three times an initial length thereof at 60° C., adsorbing iodine to the stretched film, and stretching the iodine adsorbed film to 2.5 times in a boric acid at 40° C. As a first protective layer, a triacetylcellulose film (KC2UAW, Konica Minolta Opto, Inc.) was bonded to one surface of the polarizer via an epoxy-based UV bonding agent for polarizing plates. A triacetylcellulose film (KC2UAW, Konica Minolta Opto, Inc.) was bonded to the other surface of the polarizer via the epoxy-based UV bonding agent for polarizing plates, followed by sequentially stacking a second adhesive film (thickness: 5 μm), a liquid crystal retardation film (thickness: 2 μm, Re: 240 nm at a wavelength of 550 nm, HWP, Fuji Film), second adhesive film (thickness: 5 μm), and a liquid crystal retardation film (thickness: 2 μm, Re: 120 nm at a wavelength of 550 nm, QWP, Fuji Film) on the other surface of the triacetylcellulose film (KC2UAW), thereby forming a second protective layer. Here, the second adhesive film was prepared by the same method as in Example 1 except that the compound represented by Formula 1-1 was not used. Each of the adhesive compositions prepared in Examples and Comparative Examples was coated onto one surface of the liquid crystal retardation film (QWP), dried at 90° C. for 4 minutes, and left at room temperature to form a first adhesive film having a thickness of 20 μm, thereby preparing a polarizing plate in which the first adhesive film, the liquid crystal retardation film (QWP), the second adhesive film, the liquid crystal retardation film (HWP), the second adhesive film, the triacetylcellulose film, the polarizer, and the triacetylcellulose film are sequentially stacked in the stated order.

Property Evaluation (1) Light transmittance and color value: With the first adhesive film of the polarizing plate attached to a glass plate, color value and light transmittance (%) at a wavelength of 370 nm to 600 nm were measured using a JASCO V-7100 (JASCO). In the V-7100, a reference polarizer having a polarization degree of 99.99% or more and each specimen were placed such that the absorption angle of the polarizer was tilted at an angle of 90a with respect to the absorption angle of the reference polarizer.

(2) Color temperature variation rate: With the prepared stack formed on an organic light emitting display (Galaxy S6, Samsung), the initial color temperature ($CT_1$, unit: K) of the organic light emitting display was measured using a luminance colorimeter (CS-200, KONICA MINOLTA). Further, while being driven in a light fastness tester (QUV/basic, Q-Lab), the organic light emitting display was left at 63° C. for 500 hours under a UVA-340 lamp (radiation between 280 and 400 nm) at a maximum irradiance of 0.32 W/m$^2$ and 340 nm (ASTM G154). Thereafter, the color temperature ($CT_2$, unit: K) of the organic light emitting display was measured by the same method using a colorimeter (CS-200, KONICA MINOLTA). The color temperature variation rate was calculated by the Equation 1.

As shown in Table 1, each of the polarizing plates of Examples had a significantly low light transmittance not only at wavelengths of 380 nm and 390 nm but also at wavelengths of 400 nm, 410 nm and 420 nm, and thus could sufficiently suppress damage to the light emitting device. In addition, each of the polarizing plates of Examples had a color value in a specific range and thus could be used in an optical display without damage to a light emitting device even upon exposure to external light for a long period of time.

Further, the light emitting display according to the present invention has a color temperature variation rate of 40% or less and thus can be used without damage to a light emitting device even upon exposure to external light for a long period of time. In addition, as shown in Table 1, since the polarizing plates according to the present invention had very low light transmittance not only at wavelengths of 380 nm and 390 nm but also at wavelengths of 400 nm, 410 nm and 420 nm and had a color value in a specific range, the polarizing plates could suppress damage to a light emitting device and could be used in an optical display without damage to a light emitting device even upon exposure to external light for a long period of time.

Conversely, as shown in Table 1, the polarizing plates of Comparative Examples 1 to 4 could not block UV light in a wavelength range of 390 nm to 420 nm to provide high light transmittance, causing reduction in external light stability and lifespan of the light emitting device, and had a color value out of the range according to the present invention to exhibit a yellow color and thus could not be used in a light emitting display.

Further, it could be seen that the organic light emitting displays of Comparative Example 1 to 4 exhibited a high color temperature variation rate. This phenomenon occurred when the color temperature was changed due to deterioration in color reproduction caused by degradation of the organic light emitting device by UV light.

It should be understood that various modifications, changes, alterations, and equivalent embodiments can be made by those skilled in the art without departing from the spirit and scope of the invention.

The invention claimed:

1. A polarizing plate for light emitting displays, comprising a first adhesive film, a second protective layer, a polarizer, and a first protective layer sequentially stacked in the stated order,
wherein the polarizing plate contains a UV absorber, and wherein the polarizing plate has an as value of about −2.0 to −20.0 and a bs value of about 3.0 to about 30.0, the

TABLE 1

|  |  | Example | | | | | | Comparative Example | | | |
| --- | --- | --- | --- | --- | --- | --- | --- | --- | --- | --- | --- |
|  |  | 1 | 2 | 3 | 4 | 5 | 6 | 1 | 2 | 3 | 4 |
| Compound of Formula 1-1 (parts by weight) | | 0.2 | 0.5 | 0.8 | 1.0 | 1.2 | 1.4 | — | — | — | — |
| Benzophenone (parts by weight) | | — | — | — | — | — | — | — | 0.5 | — | — |
| Triazole (parts by weight) | | — | — | — | — | — | — | — | — | 0.5 | — |
| Triazine (parts by weight) | | — | — | — | — | — | — | — | — | — | 0.5 |
| Light transmittance (%) | @380 nm | 0.1 | 0.01 | 0 | 0 | 0 | 0 | 7.6 | 4.0 | 2.1 | 1.4 |
|  | @390 nm | 1.2 | 0.07 | 0 | 0 | 0 | 0 | 10.6 | 10.0 | 7.8 | 2.6 |
|  | @400 nm | 4.3 | 0.5 | 0 | 0 | 0 | 0 | 30.6 | 30.6 | 30.6 | 30.6 |
|  | @410 nm | 13.5 | 4.02 | 0.02 | 0 | 0 | 0 | 38.8 | 38.8 | 38.8 | 38.8 |
|  | @420 nm | 29.5 | 18.16 | 1.2 | 0.5 | 0.5 | 0.5 | 41.0 | 41.0 | 41.0 | 41.0 |
| Color value | as | −2.18 | −6.29 | −8.74 | −12.6 | −12.6 | −12.6 | −0.83 | −0.83 | −0.98 | −1.21 |
|  | bs | 3.64 | 10.57 | 14.52 | 21.12 | 21.12 | 21.12 | 1.51 | 1.51 | 1.63 | 2.10 |
| Color temperature variation rate (%) | | 35 | 30 | 23 | 18 | 18 | 18 | 50 | 50 | 45 | 45 | as value and the bs value being color values of the polarizing plate as measured using a UV-VIS spectrophotometer at a wavelength of 550 nm.

2. The polarizing plate for light emitting displays according to claim 1, wherein the UV absorber is contained in at least one of the first adhesive film, the second protective layer, and the first protective layer.

3. The polarizing plate for light emitting displays according to claim 1, wherein the polarizing plate has a light transmittance of about 30% or less at a wavelength of 400 nm to 420 nm.

4. The polarizing plate for light emitting displays according to claim 1, wherein the UV absorber is contained in the first adhesive film and is present in an amount of about 0.1 wt % to about 2 wt % in the first adhesive film.

5. The polarizing plate for light emitting displays according to claim 1, wherein the UV absorber has an absorbance of about 0.8 AU to about 1.0 AU, as measured at a wavelength of 390 nm in 10 mg/L of chloroform (path 1 cm).

6. The polarizing plate for light emitting displays according to claim 1, wherein the UV absorber is represented by Formula 1:

<Formula 1> where, in Formula 1, $R^1$ is hydrogen or a substituted or unsubstituted $C_1$ to $C_{10}$ alkyl group,

$R^2$ is hydrogen or a substituted or unsubstituted $C_6$ to $C_{20}$ aryl group, $R^3$ is hydrogen or a substituted or unsubstituted $C_1$ to $C_{10}$ alkyl group,

$R^4$ is hydrogen, a cyano group (CN), or a substituted or unsubstituted $C_1$ to $C_{10}$ alkyl group, and $R^5$ is a cyano group or -(C=O)O-$R^6$ ($R^6$ being a substituted or unsubstituted $C_1$ to $C_{10}$ alkyl group or a substituted or unsubstituted $C_6$ to $C_{20}$ aryl group).

7. The polarizing plate for light emitting displays according to claim 6, wherein the UV absorber is represented by Formula 1-1 or Formula 1-2:

<Formula 1-1>

<Formula 1-2>

8. The polarizing plate for light emitting displays according to claim 1, wherein the second protective layer comprises at least one of a protective film, a protective coating layer, and a retardation film.

9. The polarizing plate for light emitting displays according to claim 8, wherein the retardation film comprises at least one of a resin film, a liquid crystal film, and a liquid crystal coating layer.

10. The polarizing plate for light emitting displays according to claim 8, wherein the retardation film comprises at least one of a first retardation film having an Re of about 100 nm to about 220 nm at a wavelength of 550 nm and a second retardation film having an Re of about 225 nm to about 350 nm at a wavelength of 550 nm.

11. The polarizing plate for light emitting displays according to claim 10, wherein the second protective layer comprises the first retardation film, the second retardation film, and the protective film sequentially stacked in the stated order.

12. The polarizing plate for light emitting displays according to claim 11, further comprising:
a second adhesive film interposed between the first retardation film and the second retardation film or between the second retardation film and the protective film,
the second adhesive film containing the UV absorber.

13. The polarizing plate for light emitting displays according to claim 1, further comprising:
a positive C plate interposed between the first adhesive film and the second protective layer.

14. A light emitting display comprising the polarizing plate for light emitting displays according to claim 1.

15. A light emitting display comprising: a light emitting display unit and a polarizing plate stacked on the light emitting display unit,
wherein the polarizing plate comprises a first adhesive film, a second protective layer, a polarizer, and a first protective layer sequentially stacked in the stated order, and contains a UV absorber; and
wherein the light emitting display has a color temperature variation rate of about 40% or less as represented by Equation 1:
<Equation 1>

Color temperature variation rate=$(CT_1-CT_2)/CT_1 \times 100$  <Equation 1>

Color temperature variation rate =$(CT_1-CT_2)/CT_1 \times 100$, where, in Equation 1, $CT_1$ is an initial color temperature (unit: K) of the light emitting display, and $CT_2$ is the color temperature (unit: K) of the light emitting display, as measured after irradiating the light emitting display with UV light under conditions of 63° C., a wavelength of 340 nm and 0.32 W/m² for 500 hours.

16. The light emitting display according to claim 15, wherein the UV absorber is contained in at least one of the first adhesive film, the second protective layer, and the first protective layer.

17. The light emitting display according to claim 15, wherein the UV absorber has an absorbance of about 0.8 AU to about 1.0 AU, as measured at a wavelength of 390 nm in 10 mg/L of chloroform (path 1 cm).

18. The light emitting display according to claim 15, wherein the UV absorber has a maximum absorption wavelength (λmax) of higher than about 390 nm to about 400 nm.

19. The light emitting display according to claim 15, wherein the UV absorber is represented by Formula 1:

<Formula 1> where, in Formula 1, $R^1$ is hydrogen or a substituted or unsubstituted $C_1$ to $C_{10}$ alkyl group, $R^2$ is hydrogen or a substituted or unsubstituted $C_6$ to $C_{20}$ aryl group, $R^3$ is hydrogen or a substituted or unsubstituted $C_1$ to $C_{10}$ alkyl group, $R^4$ is hydrogen, a cyano group (CN), or a substituted or unsubstituted $C_1$ to $C_{10}$ alkyl group, and $R^5$ is a cyano group or -(C=O)O-$R^6$ ($R^6$ being a substituted or unsubstituted $C_1$ to $C_{10}$ alkyl group or a substituted or unsubstituted $C_6$ to $C_{20}$ aryl group).

20. The light emitting display according to claim 15, wherein the polarizing plate has an as value of about −2.0 to −20.0 and a bs value of about 3.0 to about 30.0, the as value and the bs value being color values of the polarizing plate as measured using a UV-VIS spectrophotometer at a wavelength of 550 nm.

21. The light emitting display according to claim 15, wherein the polarizing plate has a light transmittance of about 30% or less at a wavelength of 400 nm to 420 nm.

22. The light emitting display according to claim 15, wherein the UV absorber is contained in the first adhesive film and is present in an amount of about 0.1 wt % to about 2 wt % in the first adhesive film.

23. The light emitting display according to claim 15, wherein the second protective layer comprises at least one of a protective film, a protective coating layer, and a retardation film.

24. The light emitting display according to claim 23, wherein the retardation film comprises at least one of a resin film, a liquid crystal film, and a liquid crystal coating layer.

25. The light emitting display according to claim 23, wherein the retardation film comprises at least one of a first retardation film having an Re of about 100 nm to about 220 nm at a wavelength of 550 nm and a second retardation film having an Re of about 225 nm to about 350 nm at a wavelength of 550 nm.

26. The light emitting display according to claim 23, wherein the second protective layer comprises the first retardation film, the second retardation film, and the protective film sequentially stacked in the stated order.

27. The light emitting display according to claim 26, further comprising:
a second adhesive film interposed between the first retardation film and the second retardation film or between the second retardation film and the protective film,
the second adhesive film containing the UV absorber.

28. The light emitting display according to claim 15, further comprising:
a positive C plate interposed between the first adhesive film and the second protective layer.

29. The light emitting display according to claim 15, wherein the light emitting display unit comprises at least one of an LED, an OLED, a QLED, and a light emitting device containing fluorescers.

\* \* \* \* \*